United States Patent
Kao et al.

(10) Patent No.: US 12,224,756 B2
(45) Date of Patent: Feb. 11, 2025

(54) CLOCK AND DATA RECOVERY CIRCUIT USING NEURAL NETWORK CIRCUIT TO OBTAIN FREQUENCY DIFFERENCE INFORMATION

(71) Applicant: MEDIATEK INC., Hsin-Chu (TW)

(72) Inventors: Chien-Kai Kao, Hsinchu (TW);
Shih-Che Hung, Hsinchu (TW);
Tse-Hsien Yeh, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 101 days.

(21) Appl. No.: 18/103,472

(22) Filed: Jan. 30, 2023

(65) Prior Publication Data
US 2024/0007110 A1    Jan. 4, 2024

Related U.S. Application Data

(60) Provisional application No. 63/367,632, filed on Jul. 4, 2022.

(51) Int. Cl.
*H04L 7/00* (2006.01)
*G06N 3/063* (2023.01)
*H03L 7/08* (2006.01)
*H03L 7/093* (2006.01)

(52) U.S. Cl.
CPC ........... *H03L 7/0807* (2013.01); *G06N 3/063* (2013.01); *H03L 7/093* (2013.01)

(58) Field of Classification Search
CPC ........ H03L 7/0807; H03L 7/093; G06N 3/063
USPC ........................................................ 375/371
See application file for complete search history.

(56) References Cited

U.S. PATENT DOCUMENTS

| | | | |
|---|---|---|---|
| 5,764,858 A * | 6/1998 | Sheu | G06N 3/065 |
| | | | 706/26 |
| 6,581,046 B1 * | 6/2003 | Ahissar | G06N 3/049 |
| | | | 706/15 |
| 8,139,702 B1 | 3/2012 | Fortin | |
| 9,231,752 B1 * | 1/2016 | Yan | H04L 7/0016 |
| (Continued) | | | |

FOREIGN PATENT DOCUMENTS

DE    102007005709 B4 *  2/2007

OTHER PUBLICATIONS

Ting-Kuei Kuan et al., A Bang-Bang Phase-Locked Loop Using Automatic Loop Gain Control and Loop Latency Reduction Techniques, IEEE Journal of Solid-State Circuits, vol. 51, No. 4, Apr. 2016, p. 821-831, XP011605237, Apr. 2016.

*Primary Examiner* — Helene E Tayong
(74) *Attorney, Agent, or Firm* — Winston Hsu

(57) ABSTRACT

The present invention includes a CDR circuit including a phase detector, a neural network circuit, a controller and a clock signal generator is disclosed. The phase detector is configured to use a clock signal to sample an input signal to generate a plurality of phase detection results. The neural network circuit is coupled to the phase detector, and is configured to receive the plurality of phase detection results to determine information of a frequency difference between the clock signal and the input signal. The controller is configured to generate a control signal according to the information of the frequency difference between the clock signal and the input signal. The clock signal generator is configured to use the control signal to adjust a phase or frequency of the clock signal outputted to the phase detector.

14 Claims, 5 Drawing Sheets

(56) References Cited

U.S. PATENT DOCUMENTS

| | | | |
|---|---|---|---|
| 9,692,429 B1 | 6/2017 | Chang | |
| 9,960,902 B1* | 5/2018 | Lin | H04L 7/033 |
| 11,128,304 B1* | 9/2021 | Yao | H04L 7/033 |
| 11,347,297 B1* | 5/2022 | Ko | G06N 3/063 |
| 11,923,858 B2* | 3/2024 | Lin | H03L 7/0807 |
| 2003/0007584 A1* | 1/2003 | Wedding | H04J 3/047 |
| | | | 375/355 |
| 2007/0183553 A1* | 8/2007 | Sanders | H03L 7/091 |
| | | | 375/376 |
| 2018/0254928 A1* | 9/2018 | Chu | H04L 25/03165 |
| 2021/0258137 A1 | 8/2021 | Park | |

* cited by examiner

CLOCK AND DATA RECOVERY CIRCUIT USING NEURAL NETWORK CIRCUIT TO OBTAIN FREQUENCY DIFFERENCE INFORMATION

CROSS REFERENCE TO RELATED APPLICATIONS

This application claims the benefit of U.S. Provisional Application No. 63/367,632, filed on Jul. 4, 2022. The content of the application is incorporated herein by reference.

BACKGROUND

A clock and data recovery (CDR) is an important component in the serial receiver, and the CDR can uses a recovered clock signal to re-time incoming input signal, and the CDR controls a phase of the recovered clock signal by continuously measuring the data transitions. However, when the incoming input signal has large jitter, the CDR is difficult to lock the phase and frequency of the input signal so that the CDR cannot work well.

SUMMARY

It is therefore an objective of the present invention to provide a CDR, which can use a neural network circuit to generate information of a frequency difference between a reference clock signal and an input signal, so that the CDR can lock the data signal successfully even if the input signal is very dirty, to solve the above-mentioned problems.

According to one embodiment of the present invention, a CDR circuit comprising a phase detector, a neural network circuit, a controller and a clock signal generator is disclosed. The phase detector is configured to use a clock signal to sample an input signal to generate a plurality of phase detection results. The neural network circuit is coupled to the phase detector, and is configured to receive the plurality of phase detection results to determine information of a frequency difference between the clock signal and the input signal. The controller is configured to generate a control signal according to the information of the frequency difference between the clock signal and the input signal. The clock signal generator is configured to use the control signal to adjust a phase or frequency of the clock signal outputted to the phase detector.

According to one embodiment of the present invention, a signal processing method of a CDR circuit is disclosed. The signal processing method comprises the steps of: using a clock signal to sample an input signal to generate a plurality of phase detection results; using a neural network circuit to receive the plurality of phase detection results to determine information of a frequency difference between the clock signal and the input signal; generating a control signal according to the information of the frequency difference between the clock signal and the input signal; and using the control signal to adjust a phase or frequency of the clock signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
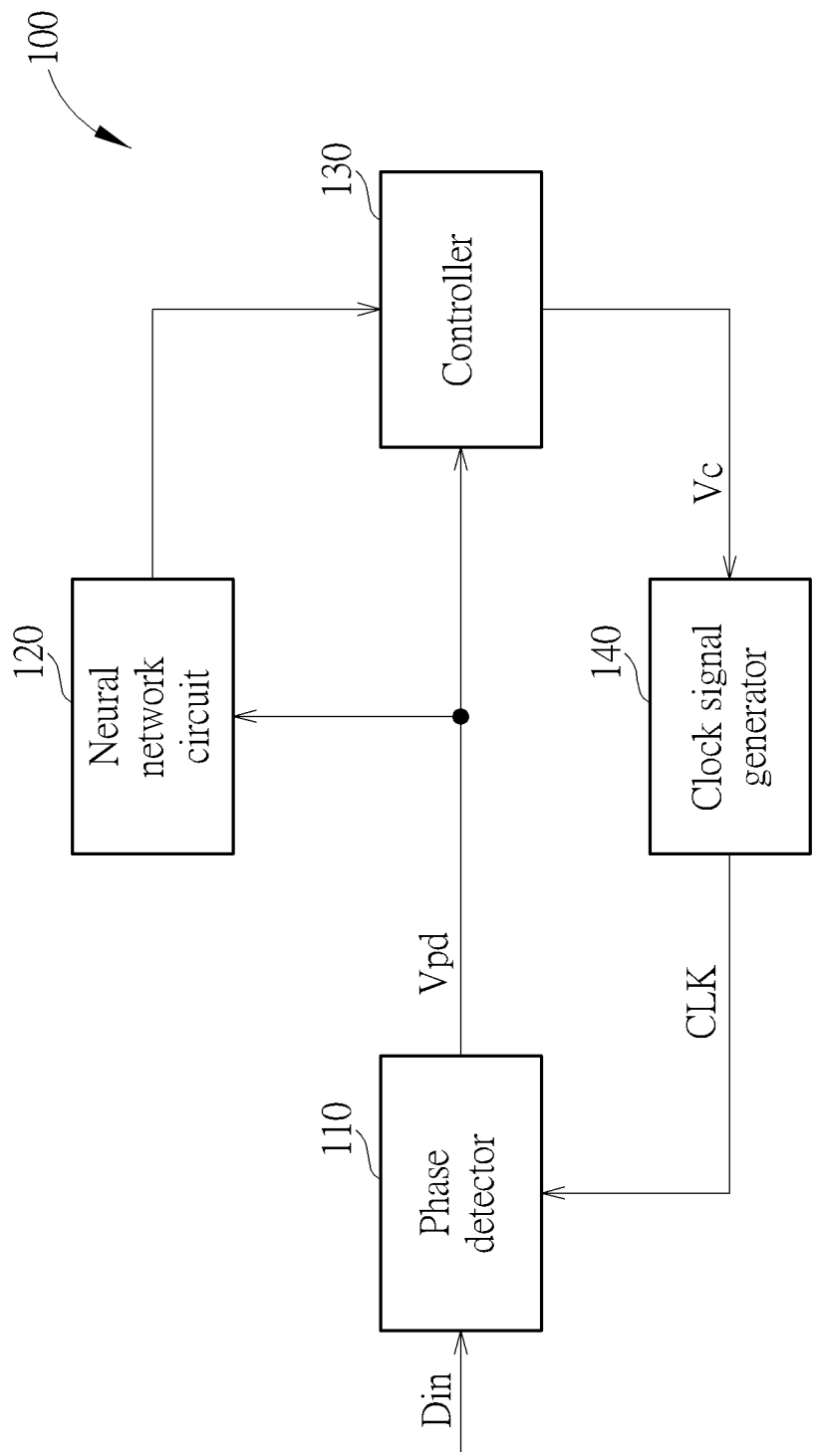
FIG. 1 is a diagram illustrating a CDR circuit according to one embodiment of the present invention.

FIG. 1 is a diagram illustrating a CDR circuit 100 according to one embodiment of the present invention. As shown in FIG. 1, the CDR circuit 100 comprises a phase detector 110, a neural network circuit 120, a controller 130 and a clock signal generator 140.

In the operations of the CDR circuit 100, initially, the CDR 100 has not used a clock signal CLK to lock a phase of an input signal (input serial data) Din, for example, the CDR circuit 100 may be just powered on, or the CDR circuit 100 starts to receive the input signal Din. The phase detector 110 receives the input signal Din and the clock signal CLK to generate a phase detection result Vpd, wherein the phase detection result Vpd indicates phase information of the input signal Din and the clock signal CLK, such that the clock signal CLK is phase-lead or phase-lag to the input signal Din and/or phase difference information. Specifically, the phase detector 110 may use a rising edge and/or a falling edge of the clock signal CLK to sample the input signal Din to generate the phase detection result Vpd, and the phase detection result Vpd may comprise phase-lead information "UP" or the phase-lag information "DN". At this time, the phase detection result Vpd is inputted into the neural network circuit 120, and the controller 130 is controlled to not use the phase detection result Vpd to generate a control signal Vc.

The phase detector 100 continuously use the clock signal CLK to sample the input signal Din to generate many phase detection results Vpd to the neural network circuit 120, and the neural network circuit 120 stores these phase detection results Vpd, and uses these past phase detection results Vpd to generate information of a frequency difference between the clock signal CLK and the input signal Din. Specifically, referring to FIG. 2, the phase detection results Vpd generated at different times serve as input vectors of the neural network circuit 120, and the neural network circuit 120 uses a grouping and filtering algorithm to process the input vectors to generate a feature map. Then, the neural network circuit 120 performs an autocorrelation operation on nodes of the feature map to calculate the frequency difference between the clock signal CLK and the input signal Din with integrators to accumulate autocorrelation results of different nodes, for an one-hot layer to generate the correct frequency difference from the result of integrators in the neural network. In detail, referring to FIG. 3, the feature map comprises a plurality of groups Ts[0]-Ts[7], each group comprises sixteen nodes [0]-[15], and each node corresponds to one phase detection result Vpd. In this embodiment, the phase detection results Vpd are sequentially arranged into the groups Ts[0]-Ts[7] over time, that is the node [0] in the group Ts[0] corresponds to the earliest phase detection result Vpd, and the node [15] in the group Ts[7] corresponds to the latest phase detection result Vpd. Then, the neural network circuit 120 performs the autocorrelation operation to determine two nodes that are orthogonal (i.e., corresponds to phase difference 90 degrees). Referring to FIG. 3, the autocorrelation operation of a node X can be represented as follows:

$$R(X)=E[f(t)*f(t-X)] \quad (1);$$

wherein R( ) is an autocorrelation result, and E[ ] is an expected value generator, f( ) is a value of a node.

If the autocorrelation result R(N) is close to zero, the neural network circuit 120 determines that an accumulation of phase difference between the clock signal CLK and the input signal Din for N cycles of the clock signal CLK is equal to 90 degrees. That is, if there is no phase difference between the clock signal CLK and the input signal Din in the node [0], after N cycles of the clock signal CLK, the phase difference between the clock signal CLK and the input signal Din will become 90 degrees. In the embodiment shown in FIG. 3, the autocorrelation result R(125) is close to zero, so the neural network circuit 120 can determine that the above value "N" is equal to "125". Then, the frequency difference between the clock signal CLK and the input signal Din can be calculated as follows:

$$(¼)*(1/\Delta f)=N*T \quad (2);$$

wherein "Δf" is the frequency difference between the clock signal CLK and the input signal Din, "T" is a period of the clock signal CLK.

Figure 2:
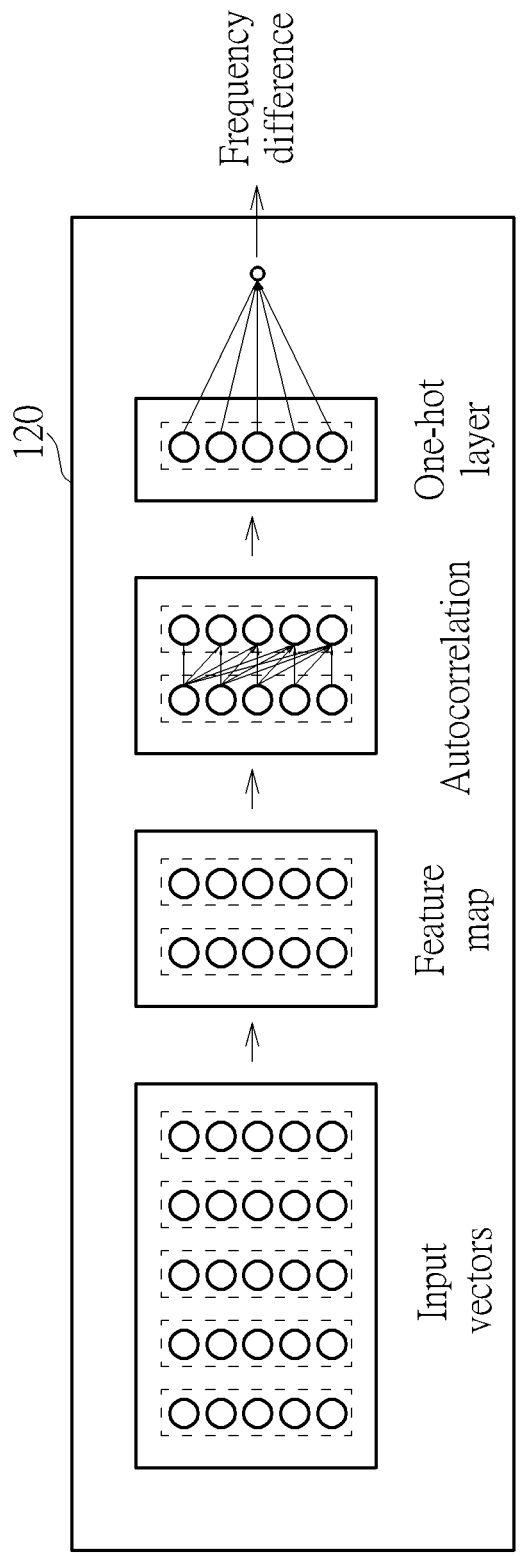
FIG. 2 is a diagram illustrating operations of the neural network circuit according to one embodiment of the present invention.
Figure 3:
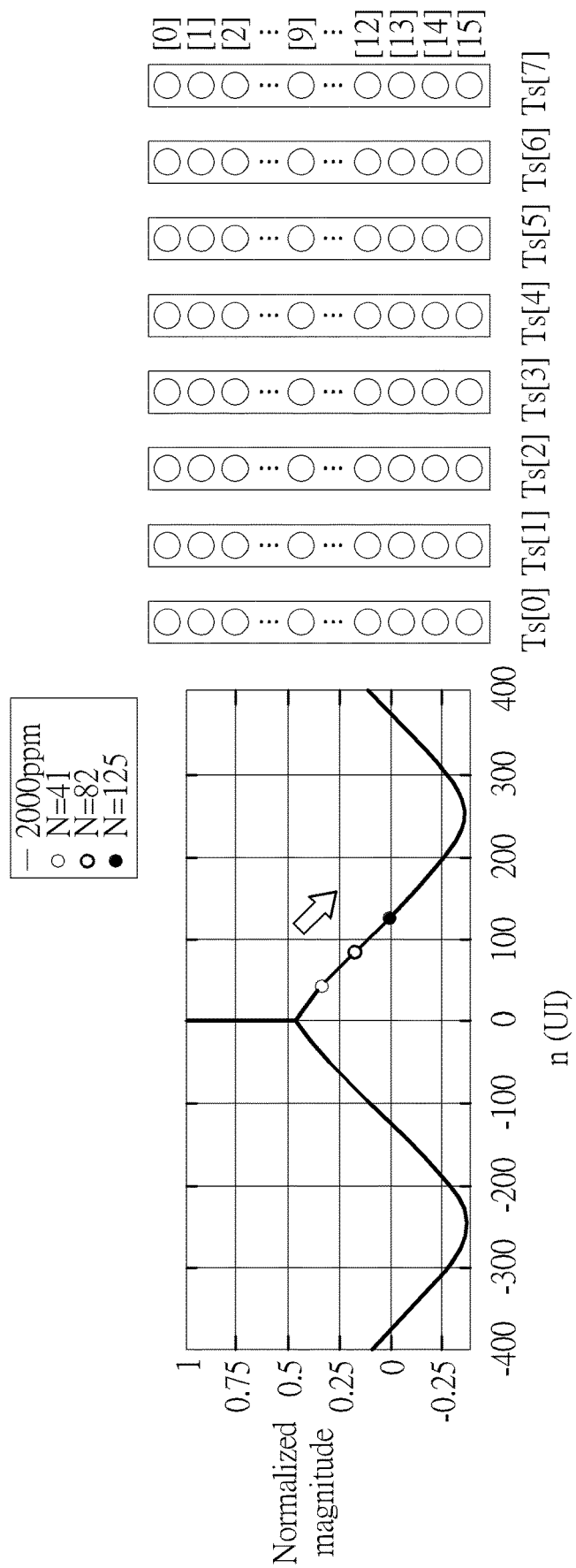
FIG. 3 is a diagram illustrating an autocorrelation operation of the neural network circuit according to one embodiment of the present invention.

In the embodiments shown in FIG. 2 and FIG. 3, the frequency difference between the clock signal CLK and the input signal Din can be calculated accurately, for the further phase adjustment of the clock signal CLK. It is noted that the above operation of the one-hot layer and the generation of feature map are known by a person skilled in the art, so the detailed descriptions are omitted here.

After the frequency difference between the clock signal CLK and the input signal Din is calculated, the neural network circuit 120 outputs the information of the frequency difference between the clock signal CLK and the input signal Din to the controller 130. At this time, the controller 130 can start to receive and use the phase detection result Vpd, and generate the control signal Vc according to the current phase detection result Vpd and the information of the frequency difference between the clock signal CLK and the input signal Din, to control the clock signal generator 140 to adjust a phase of the clock signal CLK, so that clock signal CLK locks the phase of the input signal Din (e.g., the rising edge or falling edge of the clock signal CLK aligns a zero crossing point of the data signal Din). In one embodiment, the phase of the clock signal CLK can be adjusted by integrating the frequency difference with time (e.g., phase=frequency different*time) as phase compensation. With the phase compensation, the accurate phase of the clock signal CLK will be further adjusted lead or lad by using Vpd signal.

In one embodiment, after the information of the frequency difference between the clock signal CLK and the input signal Din is generated, the neural network circuit 120 can enter a sleep mode; and the neural network circuit 120 can work again when the CDR circuit 100 needs to calculate the frequency difference between the clock signal CLK and the input signal Din again.

In light of above, by using the CDR circuit 100, the frequency difference between the clock signal CLK and the input signal Din can be calculated accurately, for the controller 130 to generate the suitable control signal Vc to control the clock signal generator 140. Therefore, the CDR circuit 100 can always work well to lock the phase of the input signal Din, even if the input signal Din has large jitter. In addition, because the CDR circuit 100 uses the neural network circuit 120 to calculate the frequency difference, the phase locking time of the CDR 100 is independent of frequency offset, data jitter and frequency of the input signal Din, that is the CDR circuit 100 can have a constant phase locking time.

Figure 4:
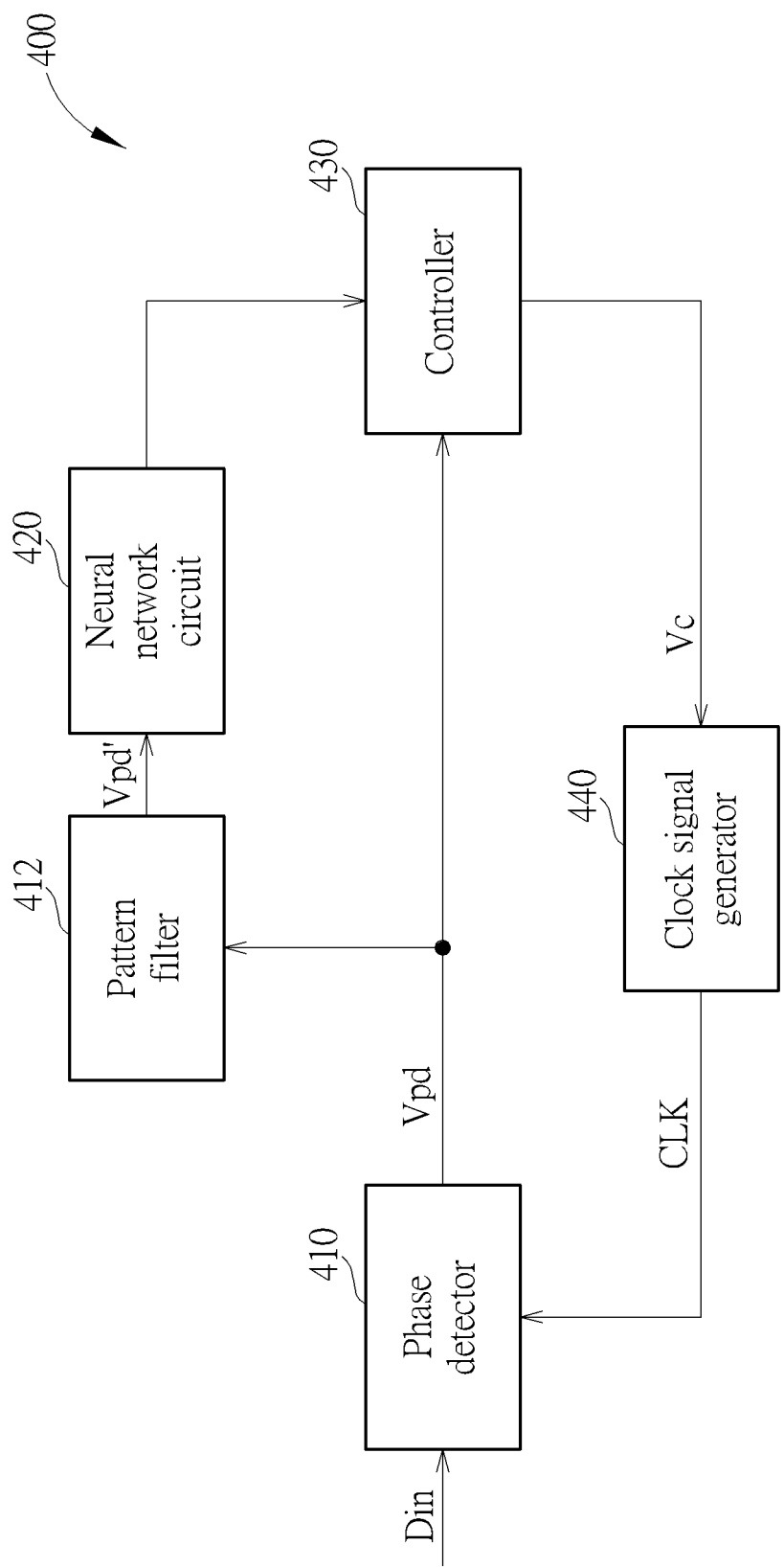
FIG. 4 is a diagram illustrating a CDR circuit according to one embodiment of the present invention.

FIG. 4 is a diagram illustrating a CDR circuit 400 according to one embodiment of the present invention. As shown in FIG. 4, the CDR circuit 400 comprises a phase detector 410, pattern filter 412, a neural network circuit 420, a controller 430 and a clock signal generator 440.

In the operations of the CDR circuit 400, initially, the CDR 400 has not used a clock signal CLK to lock a phase of an input signal (input serial data) Din, for example, the CDR circuit 400 may be just powered on, or the CDR circuit 400 starts to receive the input signal Din. The phase detector 410 receives the input signal Din and the clock signal CLK to generate a phase detection result Vpd, wherein the phase detection result Vpd indicates phase information of the input signal Din and the clock signal CLK, such that the clock signal CLK is phase-lead or phase-lag to the input signal Din and/or phase difference information. Specifically, the phase detector 410 may use a rising edge and/or a falling edge to sample the input signal Din to generate the phase detection result Vpd, and the phase detection result Vpd may comprise phase-lead information "UP" or the phase-lag information "DN". At this time, the controller 430 is controlled to not use the phase detection result Vpd to generate a control signal Vc.

The pattern filter 412 is configured to filter out noise in the phase detection results Vpd to generate filtered phase detection results Vpd'. For example, the pattern filter 412 only allows specific patterns such as "UP", "DN", "UP", "DN" . . . and "UP", "UP", "DN", "DN" to pass through; or the pattern filter 412 filters output some patterns that are unlikely to be present in the phase detection results Vpd, such as three consecutive "UP" or three consecutive "DN".

The phase detector 410 continuously use the clock signal CLK to sample the input signal Din to generate phase detection results Vpd, for the pattern filter 412 to generate the filtered phase detection results Vpd' to the neural network circuit 420, and the neural network circuit 420 stores these filtered phase detection results Vpd, and uses these past filtered phase detection results Vpd to generate information of a frequency difference between the clock signal CLK and the input signal Din. The operation of the neural network circuit 420 can refer to the above embodiments shown in FIG. 2 and FIG. 3.

After information of the frequency difference between the clock signal CLK and the input signal Din is generated, the controller 430 can start to receive and use the phase detection result Vpd, and generate the control signal Vc according to the current phase detection result Vpd and the information of the frequency difference between the clock signal CLK and the input signal Din, to control the clock signal generator 440 to adjust a phase of the clock signal CLK, so that clock signal CLK locks the phase of the input signal Din (e.g., the rising edge or falling edge of the clock signal CLK aligns a zero crossing point of the data signal Din).

In one embodiment, after the information of the frequency difference between the clock signal CLK and the input signal Din is generated, the neural network circuit 420 can enter a sleep mode; and the neural network circuit 420 can work again when the CDR circuit 400 needs to calculate the frequency difference between the clock signal CLK and the input signal Din again.

In light of above, by using the CDR circuit 400, the frequency difference between the clock signal CLK and the input signal Din can be calculated accurately, for the controller 430 to generate the suitable control signal Vc to control the clock signal generator 440. Therefore, the CDR circuit 400 can always work well to lock the phase of the input signal Din, even if the input signal Din has large jitter. In addition, the design of the pattern filter 412 make the neural network 420 have better performance due to the cleaner phase detection result.

Figure 5:
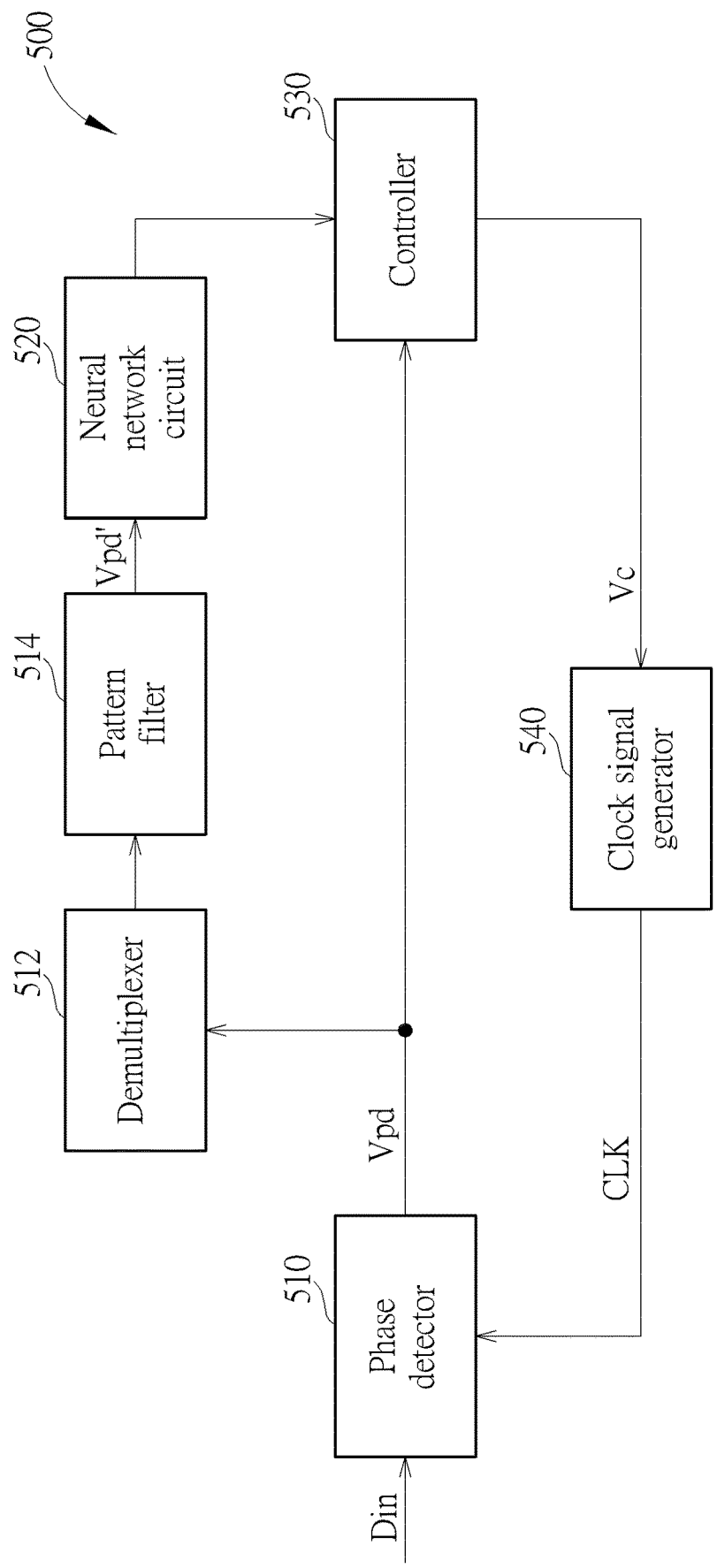
FIG. 5 is a diagram illustrating a CDR circuit according to one embodiment of the present invention.

FIG. 5 is a diagram illustrating a CDR circuit 500 according to one embodiment of the present invention. As shown in FIG. 5, the CDR circuit 500 comprises a phase detector 510, a demultiplexer 512, a pattern filter 514, a neural network circuit 520, a controller 530 and a clock signal generator 540.

In the operations of the CDR circuit 500, initially, the CDR 500 has not used a clock signal CLK to lock a phase of an input signal (input serial data) Din, for example, the CDR circuit 500 may be just powered on, or the CDR circuit 500 starts to receive the input signal Din. The phase detector 510 receives the input signal Din and the clock signal CLK to generate a phase detection result Vpd, wherein the phase detection result Vpd indicates phase information of the input signal Din and the clock signal CLK, such that the clock signal CLK is phase-lead or phase-lag to the input signal Din and/or phase difference information. Specifically, the phase detector 510 may use a rising edge and/or a falling edge to sample the input signal Din to generate the phase detection result Vpd, and the phase detection result Vpd may comprise phase-lead information "UP" or the phase-lag information "DN". At this time, the controller 530 is controlled to not use the phase detection result Vpd to generate a control signal Vc.

The demultiplexer 512 is configured to convert serial data into parallel data to lower a frequency of signals inputted into the neural network. For example, if the clock signal CLK has a frequency equal to 5 GHz, but the neural network circuit 520 can only process the signals with 500 MHz, the demultiplexer 512 can convert serial data into ten parallel data to make the signals inputted to the neural network circuit 520 have the frequency 500 MHz.

The pattern filter 514 is configured to filter out noise in the phase detection results Vpd to generate filtered phase detection results Vpd'. For example, the pattern filter 512 only allows specific patterns such as "UP", "DN", UP", "DN" . . . and "UP", "UP", "DN", "DN" to pass through; or the pattern filter 512 filters output some patterns that are unlikely to be present in the phase detection results Vpd, such as three consecutive "UP" or three consecutive "DN".

The phase detector 510 continuously use the clock signal CLK to sample the input signal Din to generate phase detection results Vpd, for the pattern filter 512 to generate the filtered phase detection results Vpd' to the neural network circuit 520, and the neural network circuit 520 stores these filtered phase detection results Vpd, and uses these past filtered phase detection results Vpd to generate information of a frequency difference between the clock signal CLK and the input signal Din. The operation of the neural network circuit 520 can refer to the above embodiments shown in FIG. 2 and FIG. 3.

After information of the frequency difference between the clock signal CLK and the input signal Din is generated, the controller 530 can start to receive and use the phase detection result Vpd, and generate the control signal Vc according to the current phase detection result Vpd and the information of the frequency difference between the clock signal CLK and the input signal Din, to control the clock signal generator 540 to adjust a phase of the clock signal CLK, so that clock signal CLK locks the phase of the input signal Din (e.g., the rising edge or falling edge of the clock signal CLK aligns a zero crossing point of the data signal Din).

In one embodiment, after the information of the frequency difference between the clock signal CLK and the input signal Din is generated, the neural network circuit 520 can enter a sleep mode; and the neural network circuit 520 can work again when the CDR circuit 500 needs to calculate the frequency difference between the clock signal CLK and the input signal Din again.

In one embodiment, the pattern filter 514 shown in FIG. 5 can be removed from the CDR circuit 500.

In light of above, by using the CDR circuit 500, the frequency difference between the clock signal CLK and the input signal Din can be calculated accurately, for the controller 530 to generate the suitable control signal Vc to control the clock signal generator 540. Therefore, the CDR circuit 500 can always work well to lock the phase of the input signal Din, even if the input signal Din has large jitter. In addition, design of the demultiplexer 512 make the phase detection result Vpd capable of being processed by the neural network 520.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock and data recovery (CDR) circuit, comprising:
a phase detector, configured to use a clock signal to sample an input signal to generate a plurality of phase detection results;
a neural network circuit, coupled to the phase detector, configured to receive the plurality of phase detection results to determine information of a frequency difference between the clock signal and the input signal;
a controller, configured to generate a control signal according to the information of the frequency difference between the clock signal and the input signal; and
a clock signal generator, configured to use the control signal to adjust a phase or frequency of the clock signal outputted to the phase detector.

2. The CDR circuit of claim 1, wherein before the neural network circuit generates the information of the frequency difference between the clock signal and the input signal, the controller does not generate the control signal to control the clock signal generator to adjust the phase of the clock signal; and after the neural network circuit generates the information of the frequency difference between the clock signal and the input signal, the controller starts to generate the control signal to control the clock signal generator to adjust the phase or frequency of the clock signal.

3. The CDR circuit of claim 2, wherein after the neural network circuit generates the information of the frequency difference between the clock signal and the input signal, the neural network circuit enters a sleep mode.

4. The CDR circuit of claim 1, wherein the neural network circuit groups the plurality of phase detection results to obtain a plurality of nodes, and performs an autocorrelation operation on at least part of the plurality of nodes to determine two nodes that are orthogonal, and determines the information of the frequency difference between the clock signal and the input signal according to the two nodes.

5. The CDR circuit of claim 1, further comprising:
a pattern filter, configured to filter the plurality of phase detection results to generate a plurality of filtered phase detection results;
wherein the neural network circuit receives the plurality of filtered phase detection results to determine the information of the frequency difference between the clock signal and the input signal.

6. The CDR circuit of claim 1, further comprising:
a demultiplexer, configured to convert the plurality of phase detection results into parallel data;
wherein the neural network circuit receives the parallel data to determine the information of the frequency difference between the clock signal and the input signal.

7. The CDR circuit of claim 6, further comprising
a pattern filter, configured to filter the parallel data to generate a plurality of filtered phase detection results;
wherein the neural network circuit receives the plurality of filtered phase detection results to determine the information of the frequency difference between the clock signal and the input signal.

8. A signal processing method of a clock and data recovery (CDR) circuit, comprising:
using a clock signal to sample an input signal to generate a plurality of phase detection results;
using a neural network circuit to receive the plurality of phase detection results to determine information of a frequency difference between the clock signal and the input signal;
generating a control signal according to the information of the frequency difference between the clock signal and the input signal; and
using the control signal to adjust a phase or frequency of the clock signal.

9. The signal processing method of claim 8, further comprising:
before the neural network circuit generates the information of the frequency difference between the clock signal and the input signal, not generating the control signal to adjust the phase or frequency of the clock signal; and
after the neural network circuit generates the information of the frequency difference between the clock signal and the input signal, starting to generate the control signal to adjust the phase or frequency of the clock signal.

10. The signal processing method of claim 9, further comprising:
after the neural network circuit generates the information of the frequency difference between the clock signal and the input signal, controlling the neural network circuit to enter a sleep mode.

11. The signal processing method of claim 8, wherein the step of using the neural network circuit to receive the plurality of phase detection results to determine information of the frequency difference between the clock signal and the input signal comprises:
grouping the plurality of phase detection results to obtain a plurality of nodes;
performing an autocorrelation operation on at least part of the plurality of nodes to determine two nodes that are orthogonal; and
determining the information of the frequency difference between the clock signal and the input signal according to the two nodes.

12. The signal processing method of claim 8, further comprising:
filtering the plurality of phase detection results to generate a plurality of filtered phase detection results;
wherein the step of using the neural network circuit to receive the plurality of phase detection results to determine the information of the frequency difference between the clock signal and the input signal comprises:
using the neural network circuit to receive the plurality of filtered phase detection results to determine the information of the frequency difference between the clock signal and the input signal.

13. The signal processing method of claim 8, further comprising:
converting the plurality of phase detection results into parallel data;
wherein the step of using the neural network circuit to receive the plurality of phase detection results to determine the information of the frequency difference between the clock signal and the input signal comprises:
using the neural network circuit to receive the parallel data to determine the information of the frequency difference between the clock signal and the input signal.

14. The signal processing method of claim 13, further comprising
filtering the parallel data to generate a plurality of filtered phase detection results;
wherein the step of using the neural network circuit to receive the plurality of phase detection results to determine the information of the frequency difference between the clock signal and the input signal comprises:
using the neural network circuit to receive the plurality of filtered phase detection results to determine the information of the frequency difference between the clock signal and the input signal.

* * * * *